(12) United States Patent
Creamer et al.

(10) Patent No.: US 9,042,536 B2
(45) Date of Patent: May 26, 2015

(54) PROGRESSIVE, TARGETED, AND VARIABLE CONFERENCE FEEDBACK TONE

(75) Inventors: Thomas E. Creamer, Boca Raton, FL (US); Kevin G. Paterson, San Antonio, TX (US); Theodore J. L. Shrader, Austin, TX (US); Nagarjuna R. Vemireddy, Charlotte, NC (US)

(73) Assignee: International Business Machines Corporation, Armonk, NY (US)

( * ) Notice: Subject to any disclaimer, the term of this patent is extended or adjusted under 35 U.S.C. 154(b) by 354 days.

(21) Appl. No.: 13/571,480

(22) Filed: Aug. 10, 2012

(65) Prior Publication Data

US 2014/0044270 A1    Feb. 13, 2014

(51) Int. Cl.
*H04M 3/56* (2006.01)
*H03G 9/00* (2006.01)
*H03G 9/02* (2006.01)

(52) U.S. Cl.
CPC .......... *H03G 9/00* (2013.01); *H03G 9/005* (2013.01); *H03G 9/025* (2013.01)

(58) Field of Classification Search
CPC .......... H04M 3/56; H04M 3/42042; H04M 3/42017; H04M 3/568; H04M 2203/351; H04M 2203/5063
USPC .......... 379/202.01, 207.16, 207.13; 381/56, 381/57; 455/416; 370/352
See application file for complete search history.

(56) References Cited

U.S. PATENT DOCUMENTS

| | | |
|---|---|---|
| 6,304,648 B1 | 10/2001 | Chang |
| 6,747,685 B2 | 6/2004 | Taib et al. |
| 2006/0067499 A1* | 3/2006 | Oliveira et al. .......... 379/202.01 |
| 2008/0304645 A1 | 12/2008 | Carlson et al. |
| 2009/0310770 A1* | 12/2009 | Longobardi et al. ..... 379/202.01 |
| 2010/0189241 A1* | 7/2010 | Miller et al. ............. 379/202.01 |
| 2014/0044271 A1 | 2/2014 | Creamer et al. |

* cited by examiner

*Primary Examiner* — Ahmad F Matar
*Assistant Examiner* — Jirapon Intavong
(74) *Attorney, Agent, or Firm* — Patterson & Sheridan, LLP

(57) ABSTRACT

System, method, and computer program product to provide targeted and variable information during a remote conference, by: responsive to a first person joining the remote conference, playing a first tone having a first acoustical characteristic indicating an arrival of the first person, responsive to a second person joining the remote conference, playing a second tone having a second acoustical characteristic indicating an arrival of the second person, the second acoustical characteristic different than the first, and responsive to one of the first person and the second person leaving the remote conference, playing a third tone having a third acoustical characteristic indicating a departure of one of the first person and the second person, the third acoustical characteristic different than the second, a type of the first, second, and third acoustical characteristics being the same, the first, second, and third tone audible to at least one person on the remote conference.

13 Claims, 6 Drawing Sheets

PROGRESSIVE, TARGETED, AND VARIABLE CONFERENCE FEEDBACK TONE

BACKGROUND

Embodiments disclosed herein relate to telephonic and virtual conferences. More specifically, embodiments disclosed herein provide progressive, targeted, and variable conference feedback tones.

Conferencing systems may emit a feedback tone which notifies the moderator and participants that a caller has joined or disconnected from the call. The conferencing system may allow moderators to turn this feature on or off. The playback of the tone during a conference may be disturbing, but disabling the feature may also be problematic in certain situations.

SUMMARY

Embodiments disclosed herein provide a system, method, and computer program product to provide targeted and variable information during a remote conference, by: responsive to a first person joining the remote conference, playing a first tone having a first acoustical characteristic indicating an arrival of the first person, responsive to a second person joining the remote conference, playing a second tone having a second acoustical characteristic indicating an arrival of the second person, the second acoustical characteristic being different than the first acoustical characteristic, and responsive to one of the first person and the second person leaving the remote conference, playing a third tone having a third acoustical characteristic indicating a departure of one of the first person and the second person, the third acoustical characteristic being different than the second acoustical characteristic, a type of the first acoustical characteristic, the second acoustical characteristic, and the third acoustical characteristic being the same, and the first tone, the second tone and the third tone are audible to at least one person joined on the remote conference.

BRIEF DESCRIPTION OF THE SEVERAL VIEWS OF THE DRAWINGS

So that the manner in which the above recited aspects are attained and can be understood in detail, a more particular description of embodiments of the invention, briefly summarized above, may be had by reference to the appended drawings.

It is to be noted, however, that the appended drawings illustrate only typical embodiments of this invention and are therefore not to be considered limiting of its scope, for the invention may admit to other equally effective embodiments.

DETAILED DESCRIPTION

Figure 1:
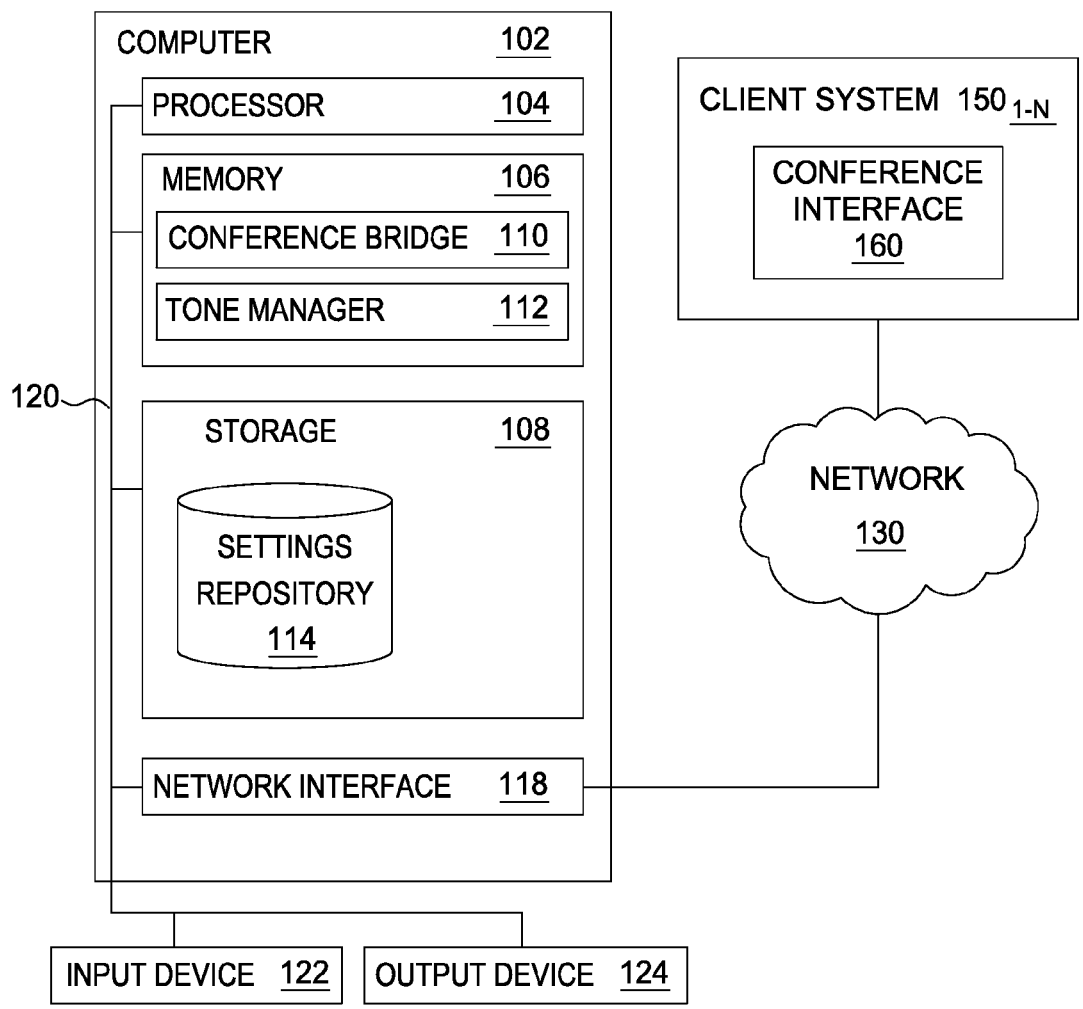
FIG. 1 is a block diagram illustrating a system for progressive, targeted, and variable conference feedback tones, according to one embodiment described herein.

Embodiments disclosed herein provide a system, method, and computer program product to provide targeted and variable information during a remote conference. Embodiments may play a first tone at a first volume indicating the arrival of the first person, responsive to a first person joining the remote conference. Additionally, responsive to a second person joining the remote conference, embodiments may play a second tone at a second volume indicating the arrival of the second person, the first volume being louder than the second volume. Embodiments may also, responsive to one of the first person and the second person leaving the remote conference, playing a third tone at a third volume indicating the departure of the one of the first person and the second person, the third volume being louder than the second volume.

Embodiments may progressively adjust an acoustical characteristic of the feedback tone played through a conferencing system based on various criteria. Examples of such criteria include, but are not limited to, the percentage of attendees that are joined to the conference and the amount of dialogue in the conference. Although embodiments of the disclosure discuss a volume of the tone as an acoustical characteristic of the tone, types of acoustical characteristics of the tone also include, but are not limited to, a pitch, frequency, tone, musical note, and waveform of the tone. Modifying the acoustical characteristic of the tone allows conference attendees to receive the feedback tone in a less intrusive and disruptive manner. The volume of the tones, and the delta between adjacent tones, may be used to indicate different events. Embodiments may also provide the ability for the conference administrator to vary the information provided in the feedback tone, or selectively emit the tone to moderators, attendees, or a subset of both. Additionally, embodiments may provide a feedback tone which includes information related to the conference, including, but not limited to, the current number of attendees, the current position in a presentation, or any information related to the current state of the conference.

In the following, reference is made to embodiments of the invention. However, it should be understood that the invention is not limited to specific described embodiments. Instead, any combination of the following features and elements, whether related to different embodiments or not, is contemplated to implement and practice the invention. Furthermore, although embodiments of the invention may achieve advantages over other possible solutions and/or over the prior art, whether or not a particular advantage is achieved by a given embodiment is not limiting of the invention. Thus, the following aspects, features, embodiments and advantages are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Embodiments of the invention may be provided to end users through a cloud computing infrastructure. Cloud computing generally refers to the provision of scalable computing resources as a service over a network. More formally, cloud computing may be defined as a computing capability that provides an abstraction between the computing resource and its underlying technical architecture (e.g., servers, storage, networks), enabling convenient, on-demand network access to a shared pool of configurable computing resources that can be rapidly provisioned and released with minimal management effort or service provider interaction. Thus, cloud computing allows a user to access virtual computing resources (e.g., storage, data, applications, and even complete virtualized computing systems) in "the cloud," without regard for the underlying physical systems (or locations of those systems) used to provide the computing resources.

Typically, cloud computing resources are provided to a user on a pay-per-use basis, where users are charged only for the computing resources actually used (e.g. an amount of storage space consumed by a user or a number of virtualized systems instantiated by the user). A user can access any of the resources that reside in the cloud at any time, and from anywhere across the Internet. In context of the present invention, a user may access applications, such as a conference tone manager application, or related data available in the cloud. For example, the conference tone manager could execute on a computing system in the cloud and manage settings for conference calls executing on the cloud computing system. In such a case, the conference tone manager could define conference tone settings and store the settings at a storage location in the cloud. Doing so allows a user to access this information from any computing system attached to a network connected to the cloud (e.g., the Internet).

FIG. 1 is a block diagram illustrating a system 100 for progressive, targeted, and variable conference feedback tones, according to one embodiment described herein. The networked system 100 includes a computer 102. The computer 102 may also be connected to other computers via a network 130. In general, the network 130 may be a telecommunications network and/or a wide area network (WAN). In a particular embodiment, the network 130 is the Internet.

The computer 102 generally includes a processor 104 connected via a bus 120 to a memory 106, a network interface device 118, a storage 108, an input device 122, and an output device 124. The computer 102 is generally under the control of an operating system (not shown). Examples of operating systems include the UNIX operating system, versions of the Microsoft Windows operating system, and distributions of the Linux operating system. (UNIX is a registered trademark of The Open Group in the United States and other countries. Microsoft and Windows are trademarks of Microsoft Corporation in the United States, other countries, or both. Linux is a registered trademark of Linus Torvalds in the United States, other countries, or both.) More generally, any operating system supporting the functions disclosed herein may be used. The processor 104 is included to be representative of a single CPU, multiple CPUs, a single CPU having multiple processing cores, and the like. Similarly, the memory 106 may be a random access memory. While the memory 106 is shown as a single identity, it should be understood that the memory 106 may comprise a plurality of modules, and that the memory 106 may exist at multiple levels, from high speed registers and caches to lower speed but larger DRAM chips. The network interface device 118 may be any type of network communications device allowing the computer 102 to communicate with other computers via the network 130.

The storage 108 may be a persistent storage device. Although the storage 108 is shown as a single unit, the storage 108 may be a combination of fixed and/or removable storage devices, such as fixed disc drives, solid state drives, floppy disc drives, tape drives, removable memory cards or optical storage. The memory 106 and the storage 108 may be part of one virtual address space spanning multiple primary and secondary storage devices. The input device 122 may be any device for providing input to the computer 102. For example, a keyboard and/or a mouse may be used. The output device 124 may be any device for providing output to a user of the computer 102. For example, the output device 124 may be any conventional display screen or set of speakers. Although shown separately from the input device 122, the output device 124 and input device 122 may be combined. For example, a display screen with an integrated touch-screen may be used.

As shown, the memory 106 contains the conference bridge 110. The conference bridge 110 is an application generally configured to run a remote conferencing system to connect a plurality of individuals through a single conference connection. The conference bridge 110 may be configured to provide a remote conference which may include, but is not limited to, a telephonic conference, a video conference, a text-based conference, or any combination thereof. Additionally, the conference bridge 110 may provide connectivity to the remote conference via a telephonic network, data network, or any combination thereof. For example, the conference bridge 110 may provide an interface for persons to join a remote conference via cell phones, land line telephones, voice over internet protocol (VoIP) phones, video telephones, and computing applications which provide voice, video, text, and text chatting capabilities via a data network. A conference may allow a moderator (a single user or group of users) to create a remote conference and distribute the remote conference information to one or more attendees, who use the information to join the remote conference.

As shown, the memory 106 contains the tone manager 112. The tone manager 112 is an application configured to control playback of certain tones during a remote conference served by the conference bridge 110. In some embodiments, the tone manager 112 may vary the volume of tones emitted when persons join or leave the remote conference, target the tones to a particular subset of users, and transmit useful information regarding the state of the remote conference through the tone. Additionally, the tone manager 112 may modify an acoustical characteristic of the tone, as described above. Although depicted as separate applications, the tone manager 112 and the conference bridge may be part of the same application. As shown, storage 108 contains settings repository 114. The settings repository 114 may be configured to store settings parameters for use by the conference bridge 110 and the tone manager 112. The settings repository 114 may store settings parameters specific to all remote conferences, some remote conferences, or a specific conference. Additionally, the settings repository 114 may store settings for individual users or groups of users to be applied to the remote conferences they create or participate in. Although depicted as a relational database, the settings repository 114 may take any form suitable for storing data.

As shown, the system 100 also includes a plurality of client systems $150_{1-N}$. The client systems may be any device capable of joining a remote conference over the network 130, such as a telephone, cellular phone, smartphone, computer, and tablet. As shown, the client systems $150_{1-N}$ also include a conference interface 160, the application through which the client systems $150_{1-N}$ participate in the remote conference. For example, the conference interface 160 may be an audio application, video application, text based application, or any combination thereof.

Figure 2:
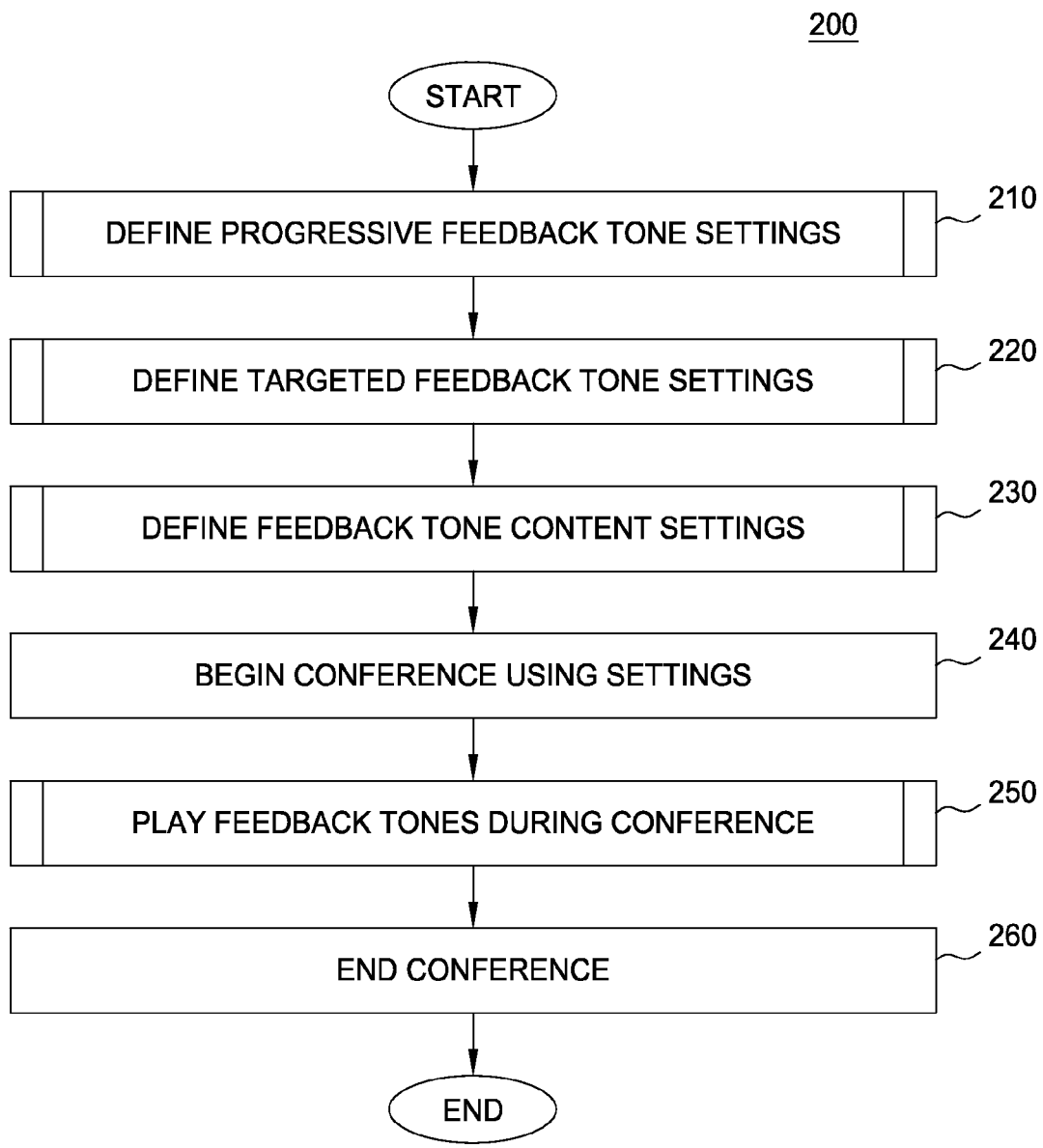
FIG. 2 is a flow chart illustrating a method for progressive, targeted, and variable conference feedback tones, according to one embodiment described herein.

FIG. 2 is a flow chart illustrating a method 200 for progressive, targeted, and variable conference feedback tones, according to one embodiment described herein. The method 200 may generally include defining a plurality of parameters related to a remote conference and conducting the remote conference in accordance with the defined parameters. Although, as described above, the remote conference may take any number of different formats, a voice telephone call format will be used in reference to FIGS. 2-6 for the sake of clarity. In some embodiments, the steps of the method 200 may be executed by the tone manager 112.

At step 210, described in greater detail with reference to FIG. 3, progressive feedback tone settings are defined. Progressive feedback tones allow for the varied playback of remote conference feedback tones. For example, progressive feedback tone settings may be defined such that the volume of feedback tones indicating a person has joined or left the conference call varies based on the ratio of callers on the conference call to the number of callers invited to the call. Additionally, the progressive feedback tone settings may quiet (or suppress) the feedback tones indicating a person has joined or left the conference call based on the level of dialogue in the conference or the time elapsed since the conference began. Additionally, the pitch, frequency, tone, musical note, and waveform of the tone may be altered in lieu of (or in addition to) altering the volume of the tone. The progressive feedback tone settings may include default parameters defined by the tone manager 112. In one embodiment, the progressive feedback tone settings are defined by a user. In some embodiments, the progressive feedback tone settings are stored in the settings repository 114. The progressive feedback tone settings may apply to all conference calls, a specific conference call, or a set of conference calls. Additionally, the progressive feedback tone settings may apply to all conference calls created/moderated by one or more moderators.

At step 220, the tone manager 112 defines targeted feedback tone settings. Targeted feedback tone settings indicate a selection of conference call participants who will receive feedback tones. In some embodiments, the feedback tones may be received by some users, no users, all users, a group of users (such as moderators, managers, participants), or any combination thereof. For example, a caller entrance feedback tone may be enabled only for conference call moderators, whereas the other participants may not hear the entrance tone. Additionally, the targeted feedback tone settings may be defined or selected for or by the moderators (or participants) of the call. For example, a moderator may configure the targeted feedback tone settings such that the feedback tone is activated only for themselves and other moderators on the call. Participants of the call may set the targeted feedback settings to emit the feedback tone only when certain participants join the conference call, such as their manager or colleagues. Targeted feedback tone settings are discussed in further detail with reference to FIG. 4. The targeted feedback tone settings may include default parameters defined by the tone manager 112, or they may be defined by a user. As discussed above, the targeted feedback tone settings may be stored in the settings repository 114 and may apply to all conference calls, one conference call, or a set of conference calls. Additionally, the targeted feedback tone settings may apply to all conference calls created/moderated by one or more moderators.

At step 230, the tone manager 112 may define feedback tone content settings. In addition to (or in lieu of) a tone, the tone manager 112 may provide information related to the conference call when participants join or exit the call. For example, the tone may include information related to the current number of attendees on the call, a current slide number in a presentation, or any other information related to the call to help the new attendees up to speed with the current state of the conference. Feedback tone content settings are described in greater detail with reference to FIG. 5. The feedback tone content settings may include default parameters defined by the tone manager 112, or they may be defined by a user. In some embodiments, the feedback tone content settings may be stored in the settings repository 114. In some embodiments, the feedback tone content settings may apply to all conference calls, one conference call, or more than one conference call. Additionally, the feedback tone content settings may apply to all conference calls created/moderated by one or more moderators.

At step 240, a conference call begins. This step may comprise a conference call moderator establishing the conference call. When the conference call is initiated, the tone manager 112 may retrieve the applicable settings from the settings repository 113. At step 250, discussed in greater detail with reference to FIG. 6, feedback tones are played during the conference call based on the defined settings. Generally, when callers join or exit the conference call, the tone manager 112 may play feedback tones based on the settings applicable to the conference call. At step 260, the conference call ends.

Figure 3:
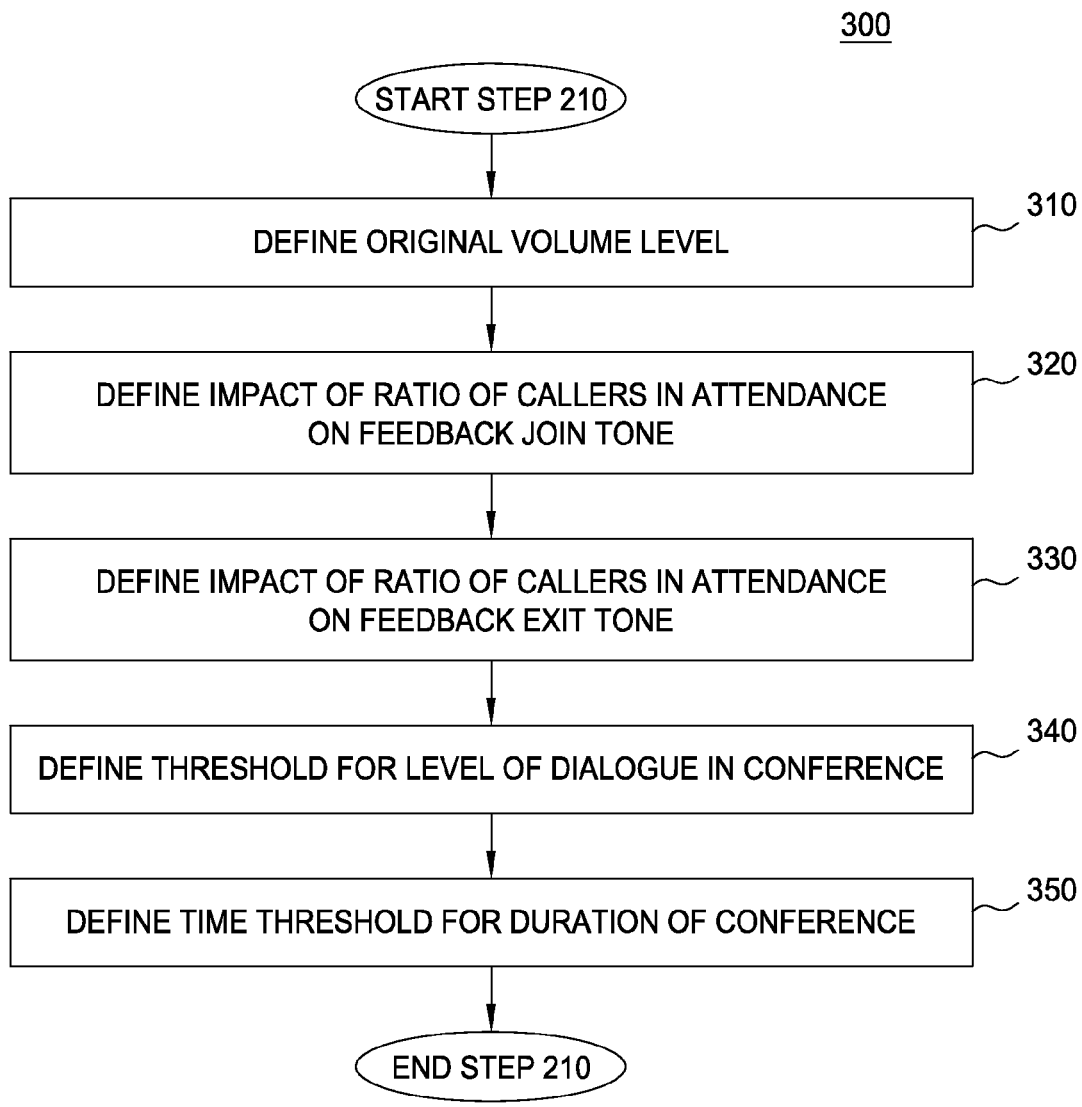
FIG. 3 is a flow chart illustrating a method to define progressive feedback tone settings, according to one embodiment disclosed herein.

FIG. 3 is a flow chart illustrating a method 300 corresponding to step 210 to define progressive feedback tone settings, according to one embodiment disclosed herein. Generally, the method 300 includes settings which progressively vary the volume (or suppress playback altogether) of a feedback tone played when a caller joins or exits the conference call. Alternatively, a different acoustical characteristic of the tone may be progressively varied. As more people join the conference call, or as more conversation occurs during the conference, the feedback tone is progressively made quieter. As more people disconnect from the conference, the feedback tone is progressively returned to its original volume level. In some embodiments, the tone manager 112 performs the steps of the method 300. Although depicted as a flow chart, less than all of the steps of the method 300 may be performed. The progressive feedback settings may be default settings defined by the tone manager 112, or may be defined by a user.

At step 310, the tone manager 112 may set an original volume level for feedback tones. By defining the original volume level, the tone manager 112 may have a baseline volume which may be modified based on the other factors described herein. The original volume level may be stored in the settings repository 114. At step 320, the tone manager 112 defines the impact of the ratio of callers on the feedback tone played when a caller joins the conference call. In some embodiments, the original volume level may be progressively reduced based on the ratio of callers currently on the conference call to the number of invited (or expected) callers. The progressive reduction may be directly proportional to the ratio, or may be based on any method sufficient to progressively reduce the volume. For example, if a total of 10 attendees were expected on a call, when each caller joins, the original volume level may be reduced by 10% for each caller who joins. Therefore, when the fifth caller joins, the feedback tone may be played at 50% of the original volume level. When the tenth (or higher) person joins the conference call, the feedback tone may be disabled. In some embodiments, the number of invited callers may be stored in the settings repository 114 for the call.

At step 330, the tone manager 112 defines the impact of the ratio of callers on the feedback tone played when a caller exits the conference call. In some embodiments, the current volume level may be progressively increased based on the ratio of callers currently on the conference call to the number of invited (or expected) callers. The progressive increase may be directly proportional to the ratio, or may be based on any method sufficient to progressively increase the volume back to the original volume level. For example, if a total of 10 attendees were expected on a call, when each caller exits, the original volume level may be increased by 10% for each caller who exits. Therefore, when the eighth caller exits, the feedback tone may be played at 80% of the original volume level.

At step 340, the tone manager 112 may define a threshold for a level of dialogue in the conference, which, when exceeded, further weights the progressive quieting (or ceases playback) of the feedback tones. The threshold may be based on a volume of the dialogue (such as a number of decibels), or a time duration of the dialogue. The tone manager 112 may monitor the conversation levels of the conference call in order to determine whether the threshold is exceeded. For example, the threshold may be defined to be a period of conversation exceeding five seconds. The tone manager 112, upon detecting conversation exceeding five seconds in duration, may further reduce the volume level of the feedback tones. When the level of conversation returns below the threshold, the tone manager 122 may remove the reduction in volume of the feedback tone. In some embodiments, the tone manager 112 may alternatively delay the feedback tone until a period of time, such as a few seconds, of no conversation being detected in the conference call.

At step 350, the tone manager 112 may define a time threshold for a duration of the conference call, which, when exceeded, further weights the progressive quieting (or ceases playback) of the feedback tones. Any number of time thresholds may be set, which may affect the weighting of the progressive quieting of the feedback tones, or may completely cease playback of the feedback tones. For example, after five minutes, the tone manager 112 may further decrease the feedback tone volume by 5%; by 10% after 10 minutes; and cease emitting a feedback tone after 15 minutes in duration of the conference call.

Figure 4:
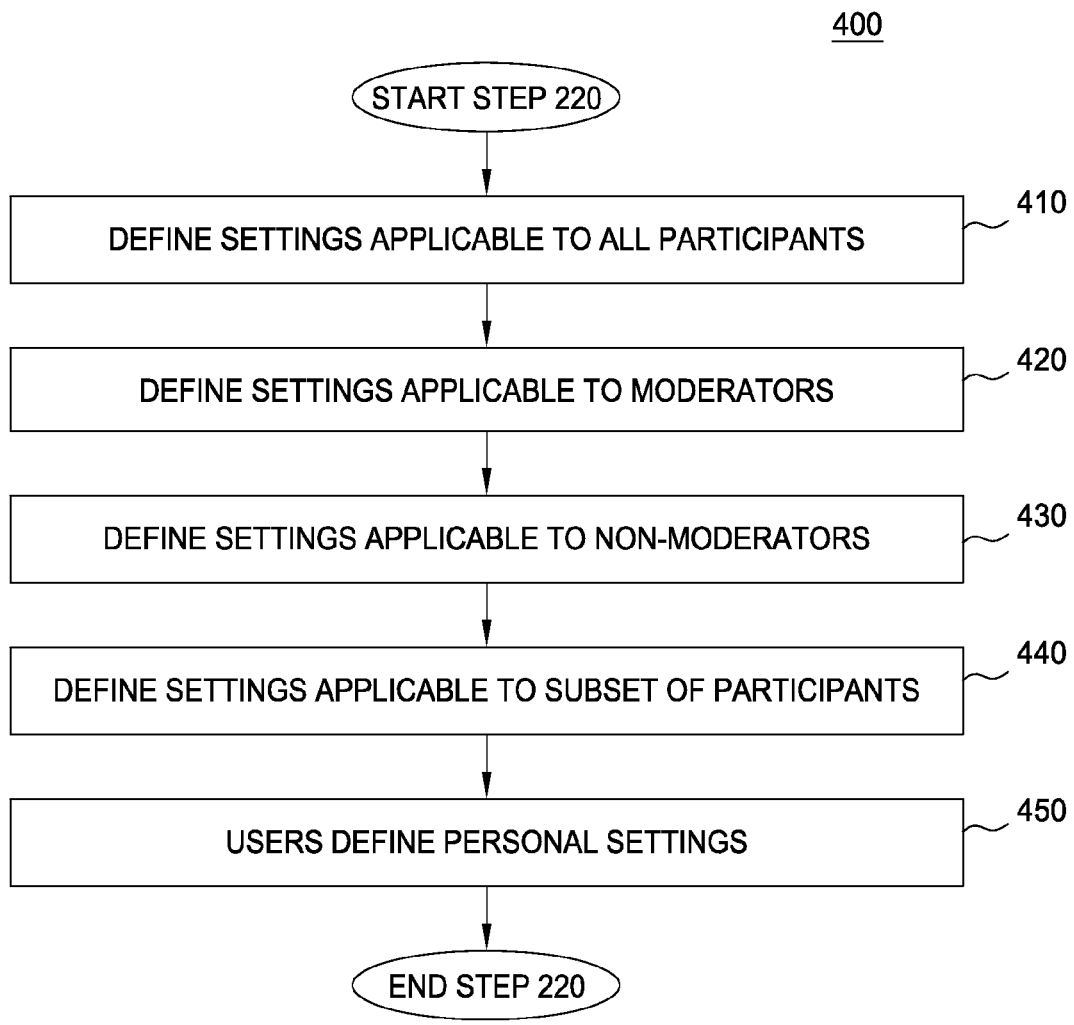
FIG. 4 is a flow chart illustrating a method to define targeted feedback tone settings, according to one embodiment disclosed herein.

FIG. 4 is a flow chart illustrating a method 400 corresponding to step 220 to define targeted feedback tone settings, according to one embodiment disclosed herein. A targeted feedback tone may be directed at a specific person, multiple persons, or groups of persons. With the role of moderators and other attendees being determined prior to joining the conference call, such as through the use of different pass codes, an ID number, a telephone number, or person name, the tone manager 112 may selectively target the emission of a feedback tone to varying sets or subsets of participants. The tone manager 112 may store the settings in the settings repository 114. The settings may be applicable to all conference calls, a single call, or all calls for a specific user (or users). Although depicted as a flow chart, one, several, or all of the steps of the method 400 may be performed to define targeted feedback tone settings. The targeted feedback settings may be default settings defined by the tone manager 112, or may be defined by a user.

At step 410, the tone manager 112 defines settings that are applicable to all conference call participants. For example, the tone manager 112 may require that all participants receive feedback tones which indicate the arrival and departure of moderators to the conference call. At step 420, the tone manager 112 defines settings that are applicable to moderators of the conference call. For example, the tone manager 112 may specify that moderators do not receive feedback tones when non-moderators attend the conference call when over 20 persons are expected to join the conference call. At step 430, the tone manager 112 may define settings applicable to non-moderators of the call. For example, the tone manager 112 may specify that non-moderators receive feedback tones when moderators join or exit the conference. At step 440, the tone manager 112 defines settings applicable to a subset of participants which may not necessarily fall into the "moderator" and "non-moderator" category, or may fall into a subset of both. For example, the directors of a division may only receive feedback tones indicating the arrival and departure of other directors on the conference call. At step 450, call participants may define personal settings of their own. A user interface may be provided by the tone manager 112 to receive user input specific to their own personal accounts, for storage in the settings repository 114. For example, some users may specify that they only want to receive feedback tones when their manager or immediate group of colleagues join or depart the conference call, while other users may specify that they would like to receive all feedback tones. The conference call moderator, or the tone manager 112, may define settings which override user settings in the event of a conflict. Indeed, any combination of settings may be specified based on the steps of the method 400.

Figure 5:
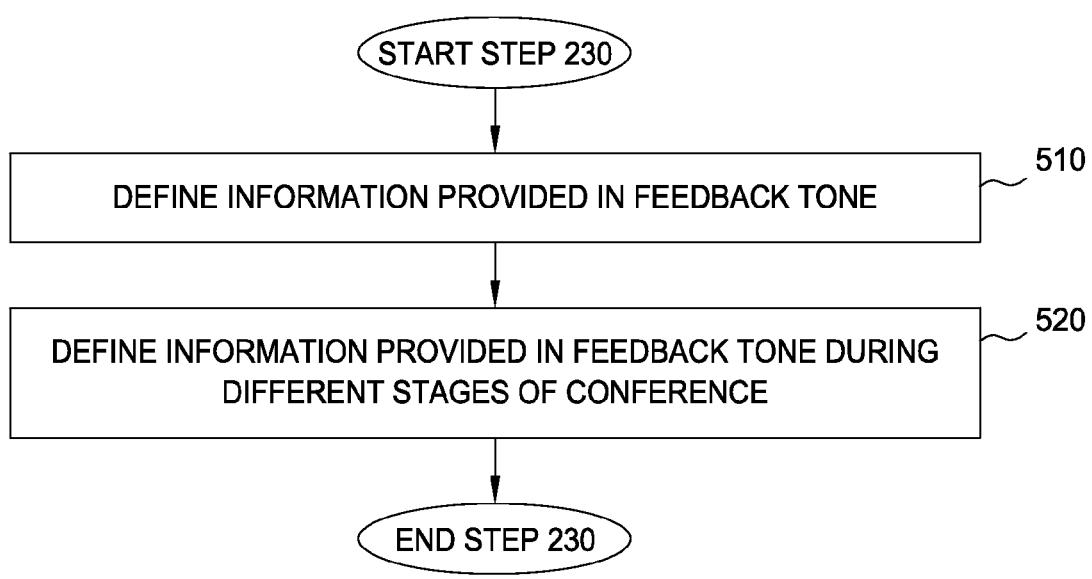
FIG. 5 is a flow chart illustrating a method to define feedback tone content settings, according to one embodiment disclosed herein.

FIG. 5 is a flow chart illustrating a method 500 corresponding to step 230 to define feedback tone content settings, according to one embodiment disclosed herein. In addition to playing a tone, the tone manager 112 may provide detailed information about the caller joining or leaving as well as information regarding the state of the conference. The feedback tone content settings may be default settings defined by the tone manager 112, or may be defined by a user. At step 510, the tone manager 112 defines the information provided in the feedback tone. For example, the tone manager 112 may provide the current number of conference call attendees, state information such as the current slide number in a presentation, and the current time duration of the conference call. At step 520, the tone manager 112 may define information provided through the feedback tone during different stages of the conference call. For example, attendees who join before the conference slides or shared meeting presentation are presented may receive a regular tone, and attendees who join after a conference call has started may receive a short voice message as instructions to join a web conference already in progress. Additionally, the information may be targeted to specific individuals (or groups). For example, moderators could always hear a tone that gives the number of attendees which fades in volume or pitch as more attendees join, while non-moderators may not hear feedback tones after the conference call begins.

Figure 6:
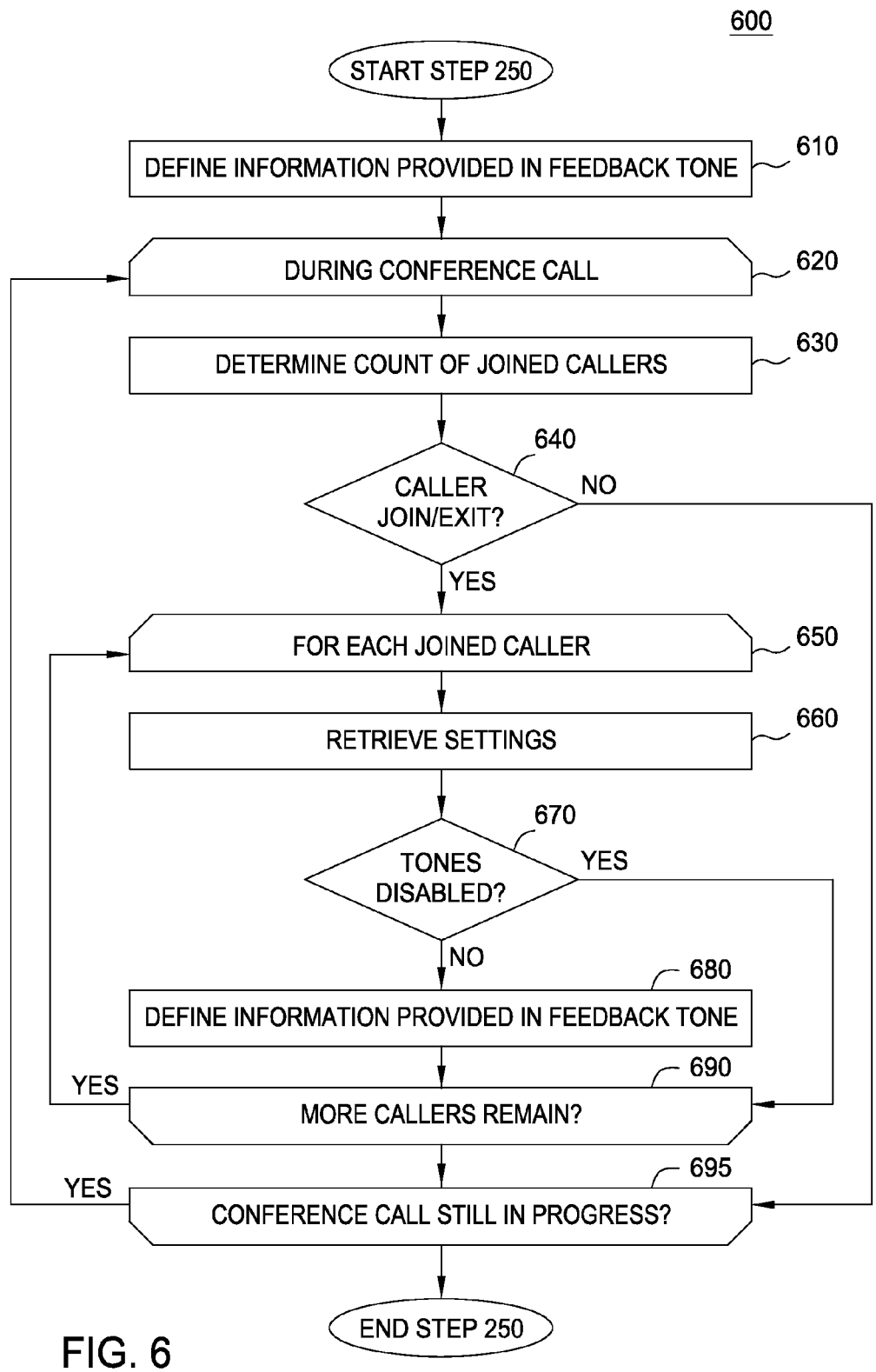
FIG. 6 is a flow chart illustrating a method to play conference feedback tones during a conference, according to one embodiment disclosed herein.

FIG. 6 is a flow chart illustrating a method 600 corresponding to step 250 to play feedback tones during a conference, according to one embodiment disclosed herein. In some embodiments, the steps of the method 600 are performed by the tone manager 112. At step 610, the tone manager 112 may retrieve a number of callers expected to join the conference. This number may be retrieved from the settings repository 114, or may be provided by a moderator or other user. At step 620, a loop including steps 630-695 begins for the duration of the conference call. At step 630, the tone manager 112 determines a count of the number of callers joined on the conference call. In some embodiments, the tone manager 112 maintains a count of the number of callers; in some other embodiments. At step 640, the tone manager 112 determines whether a caller has joined or exited the conference call. If a caller has joined or exited, the method proceeds to step 650, otherwise, the method proceeds to step 695. At step 650, a loop including steps 660-690 begins for each caller joined to the conference call. At step 660, the tone manager 112 retrieves the targeted, progressive, and content settings for the conference and the current caller. In some embodiments, the tone manager 112 retrieves the settings from the settings repository 114. At step 670, the tone manager 112 determines whether tones have been disabled for the caller in the current context. For example, if the joined or exiting caller is a moderator, the caller may have disabled feedback tones for moderators. If the feedback tone is disabled, the method proceeds to step 690; otherwise, the method proceeds to step 670. At step 680, the tone manager 112 plays the feedback tone based on the conference call and user settings. At step 690, the tone manager 112 determines whether more callers remain for analysis. If more callers remain, the method returns to step 650. Otherwise, the tone manager 112 proceeds to step 695. At step 695, the tone manager 112 determines whether the conference call is still in progress. If the conference call is still in progress, the tone manager 112 proceeds to step 620. Otherwise, the method 600 ends.

Embodiments disclosed herein can include all design aspects, a subset of aspects, and any combination of design aspects. For example, a conferencing system based on this disclosure may choose to provide progressive and variable tones, but not immediately provide targeted tones.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While the foregoing is directed to embodiments of the present invention, other and further embodiments of the invention may be devised without departing from the basic scope thereof, and the scope thereof is determined by the claims that follow.

What is claimed is:

1. A computer program product, comprising:
a non-transitory computer-readable storage medium having computer-readable program code embodied therewith, the computer-readable program code comprising:
computer-readable program code configured to determine a level of conversation in a remote conference based on at least one of: (i) a volume of the conversation, and (ii) an elapsed time of continuous conversation in the remote conference;
computer-readable program code configured to, responsive to a first person joining the remote conference, play a first tone having a first volume indicating an arrival of the first person;
computer-readable program code configured to, responsive to a second person joining the remote conference, play a second tone having a second volume indicating an arrival of the second person, wherein the second volume is different than the first volume; and
computer-readable program code configured to, responsive to one of the first person and the second person leaving the remote conference, play a third tone having a third volume indicating a departure of one of the first person and the second person, wherein the third volume is different than the second volume, wherein the first, second, and third volumes are respectively reduced upon determining the level of conversation exceeds a threshold and wherein the first tone, the second tone and the third tone are audible to at least one person joined on the remote conference.

2. The computer program product of claim 1, wherein the first tone, the second tone, and the third tone further comprise: (i) a frequency of the respective tone, and (ii) a waveform of the respective tone, the computer-readable program code further comprising:
computer-readable program code configured to determine a ratio of a current number of attendees joined to the remote conference to a number of expected attendees of the remote conference, wherein at least one of the volume, the frequency, and the waveform of the respective tones are based on the ratio.

3. The computer program product of claim 1, wherein the threshold comprises at least one of: (i) a predefined volume of the conversation, and (ii) a predefined duration of continuous conversation in the remote conference, wherein the computer-readable program code further comprises:
computer-readable program code configured to, responsive to a fourth participant joining the remote conference, not play a fourth tone to indicate the arrival of the fourth participant based on the determined level of conversation.

4. The computer program product of claim 1,
wherein the first tone, the second tone, and the third tone are not played upon determining that an elapsed time of the remote conference exceeds a predefined timing threshold.

5. The computer program product of claim 1, wherein at least one of the first tone, the second tone, and the third tone convey at least one attribute of the remote conference, the at least one attribute selected from the group of: (i) a current number of attendees of the remote conference, (ii) a current slide number in a presentation, and (iii) instructions related to the remote conference.

6. The computer program product of claim 1, wherein at least one of the first tone, the second tone, and the third tone is not played to at least one other person on the remote conference; wherein at least one of the first tone, the second tone, and the third tone is targeted to a predefined group comprising at least one other person.

7. The computer program product of claim 1, wherein the remote conference is at least one of: (i) an audio, and (ii) a video conference, wherein the remote conference is accessible by at least one of: (i) a telephonic network, (ii) a data network.

8. A system, comprising:
one or more computer processors; and
a memory containing a program, which, when executed, performs an operation comprising:
determining a level of conversation in a remote conference based on at least one of: (i) a volume of the conversation, and (ii) an elapsed time of continuous conversation in the remote conference;
responsive to a first person joining the remote conference, playing a first tone having a first volume indicating an arrival of the first person;
responsive to a second person joining the remote conference, playing a second tone having a second volume indicating an arrival of the second person, wherein the second volume is different than the first volume; and
responsive to one of the first person and the second person leaving the remote conference, playing a third tone having a third volume indicating a departure of one of the first person and the second person, wherein the third volume is different than the second volume, wherein the first, second, and third volumes are respectively reduced upon determining the level of conversation exceeds a threshold and wherein the first tone, the second tone and the third tone are audible to at least one person joined on the remote conference.

9. The system of claim 8, wherein the first tone, the second tone, and the third tone further comprise: (i) a frequency of the respective tone, and (ii) a waveform of the respective tone, wherein the operation further comprises:
computing a ratio of a current number of attendees joined to the remote conference to a number of expected attendees of the remote conference, wherein at least one of the volume, the frequency, and the waveform of the respective tones are based on the ratio.

10. The system of claim 8, wherein the threshold comprises at least one of: (i) a predefined volume of the conversation, and (ii) a predefined duration of continuous conversation in the remote conference, wherein the operation further comprises:
responsive to a fourth participant joining the remote conference, not playing a fourth tone to indicate the arrival of the fourth participant based on the determined level of conversation.

11. The system of claim 8,
wherein the first tone, the second tone, and the third tone are not played upon determining that an elapsed time of the remote conference exceeds a predefined timing threshold.

12. The system of claim 10, wherein at least one of the first tone, the second tone, and the third tone convey at least one attribute of the remote conference, the at least one attribute selected from the group of: (i) a current number of attendees of the remote conference, (ii) a current slide number in a presentation, and (iii) instructions related to the remote conference.

13. The system of claim 10, wherein at least one of the first tone, the second tone, and the third tone is not played to at least one other person on the remote conference; wherein at least one of the first tone, the second tone, and the third tone is targeted to a predefined group comprising at least one other person; wherein the remote conference is at least one of: (i) an audio, and (ii) a video conference, wherein the remote conference is accessible by at least one of: (i) a telephonic network, (ii) a data network.

\* \* \* \* \*